US008766271B2

(12) United States Patent
Kim et al.

(10) Patent No.: US 8,766,271 B2
(45) Date of Patent: Jul. 1, 2014

(54) FLEXIBLE DISPLAY APPARATUS

(75) Inventors: Kwang-Min Kim, Yongin (KR);
Won-Kyu Kwak, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/488,404

(22) Filed: Jun. 4, 2012

(65) Prior Publication Data

US 2013/0112984 A1    May 9, 2013

(30) Foreign Application Priority Data

Nov. 3, 2011 (KR) .................. 10-2011-0114125

(51) Int. Cl.
*H01L 27/14*    (2006.01)
(52) U.S. Cl.
USPC ................... 257/72; 257/E27.121
(58) Field of Classification Search
USPC .......................................... 257/72
IPC ................................. H01L 27/3244
See application file for complete search history.

(56) References Cited

U.S. PATENT DOCUMENTS

2011/0254758 A1* 10/2011 Lin et al. .................. 345/84

FOREIGN PATENT DOCUMENTS

| JP | 2010-224426 | 10/2010 |
| KR | 10-2006-0095142 A | 8/2006 |
| KR | 10-2007-0011752 A | 1/2007 |
| KR | 10-2007-0115068 A | 12/2007 |
| KR | 10-2008-0073942 A | 8/2008 |

OTHER PUBLICATIONS

Korean Patent No. 1020070011752 [Machine's translation].*
Korean Patent No. 1020070115068 [Machine's translation].*

* cited by examiner

*Primary Examiner* — Tony Tran
(74) *Attorney, Agent, or Firm* — Christie, Parker & Hale, LLP

(57) ABSTRACT

A flexible display apparatus is disclosed. The flexible display apparatus includes: a substrate on which a display unit for displaying an image, a non-display area formed outside the display unit, and at least one pad for inputting an electrical signal to the display unit are located; and a circuit board including circuit terminals to be electrically connected to the at least one pad. A stiffener including a plurality of reinforcement lines that are patterned to reduce or prevent thermal deformation of the substrate is formed on the substrate.

14 Claims, 3 Drawing Sheets

FLEXIBLE DISPLAY APPARATUS

CROSS-REFERENCE TO RELATED PATENT APPLICATION

This application claims priority to and the benefit of Korean Patent Application No. 10-2011-0114125, filed on Nov. 3, 2011 in the Korean Intellectual Property Office, the entire content of which is incorporated herein by reference.

BACKGROUND

1. Field

Aspects of embodiments of the present invention relate to a display apparatus, and more particularly, to a flexible display apparatus.

2. Description of Related Art

Flat display apparatuses may be generally classified into light-emitting type flat display apparatuses and light-receiving type flat display apparatuses. The light-emitting type flat display apparatuses include organic light-emitting display apparatuses, plasma display panels (PDPs), cathode ray tubes (CRTs), vacuum fluorescent displays (VFDs), light emitting diodes (LEDs), and the like. The light-receiving type flat display apparatuses include liquid crystal display (LCD) apparatuses and the like.

Among the light-emitting type flat display apparatuses, the organic light-emitting display apparatuses have superior characteristics such as wide viewing angles, excellent contrast, and short response times. Thus, the organic light-emitting display apparatuses have been in the spotlight because they can be applied to electronic/electric products, such as digital cameras, video cameras, camcorders, portable information terminals, smart phones, ultra-slim laptop computers, tablet personal computers (PCs), display apparatuses for mobile devices such as flexible display apparatuses, or ultra-thin TVs.

Flexible display apparatuses that may be easily formed and may be applied to various shapes of devices have been recently researched and developed as next-generation display apparatuses. Among them, flexible display apparatuses based on organic light-emitting display technology are the most significant.

However, since flexible display apparatuses have to include a flexible substrate, the substrate of a flexible display apparatus have lower hardness and smaller thickness than those of a general glass substrate. Further, when a flexible display apparatus is manufactured, the substrate may be subject to expansion by heat or contraction. In addition, a position at which the substrate of the flexible display device expands or contracts is not easily predicted. Thus, the workability and yield of a subsequent process of heating the substrate, for example, a bonding process, may be rapidly lowered. Such processes can lead to thermal deformation of the substrate, such as expansion or contraction.

SUMMARY

Aspects of embodiments of the present invention relate to a display apparatus, and more particularly, to a flexible display apparatus in which a circuit terminal of a circuit board may be easily connected to a pad of a flexible substrate. In further detail, one or more aspects of the present invention provide for a flexible display apparatus in which a circuit terminal of a circuit board may be easily connected to a pad of a flexible substrate by reducing or minimizing a change of expansion or contraction of the flexible substrate. By reducing or minimizing a change of expansion or contraction of the flexible substrate, aspects of embodiments can reduce or prevent thermal deformation of the substrate of a flexible display apparatus.

According to an exemplary embodiment of the present invention, a flexible display apparatus is provided. The flexible display apparatus includes: a substrate on which a display unit for displaying an image, a non-display area formed outside the display unit, and at least one pad for inputting an electrical signal to the display unit are located; and a circuit board including circuit terminals to be electrically connected to the at least one pad. A stiffener including a plurality of reinforcement lines that are patterned to reduce or prevent thermal deformation of the substrate is formed on the substrate.

The reinforcement lines may be arranged apart from one another by a first distance in one direction of the substrate and may be arranged in another direction of the substrate to constitute an aggregate having a regular pattern.

Patterns of the reinforcement lines may be separated from one another. A space may be formed between adjacent reinforcement lines.

The reinforcement lines may include one selected from the group consisting of a plurality of serpentine type patterns, a plurality of zigzag type patterns, a plurality of network type patterns, a plurality of honeycomb type patterns, a plurality of straight type patterns, a plurality of curve type patterns, a plurality of circular shapes, and a plurality of polygonal shapes.

The at least one pad may overlay at least a portion of the reinforcement lines.

The reinforcement lines may be arranged between the at least one pad and the substrate.

An insulating material may be further deposited between the stiffener and the at least one pad.

The at least one pad may be arranged in a first direction of the substrate. Each reinforcement line may be arranged in the first direction. A perimeter of an aggregate of the reinforcement lines may be arranged to contain a perimeter of the at least one pad in a second direction of the substrate that crosses the first direction.

A thermal expansion coefficient of each reinforcement line may be smaller than a thermal expansion coefficient of the substrate.

The substrate may be formed of a polymer. Each reinforcement line may be formed of metal.

The substrate may include a flexible substrate.

The substrate may be formed of one selected from the group consisting of polyimide (PI), polycarbonate (PC), polyethersulphone (PES), polyethylene terephthalate (PET), polyethylenenaphthalate (PEN), polyarylate (PAR), or fiber glass reinforced plastic (FRP).

The at least one pad may be arranged on the non-display area of the substrate. The stiffener may be patterned between the substrate and the at least one pad.

An insulating material may be further deposited between the at least one pad and the stiffener.

The display unit may include an organic light-emitting display apparatus including: a semiconductor active layer having a source/drain region and a channel region; a gate insulating layer formed on the semiconductor active layer; a gate electrode formed on the gate insulating layer; an interlayer insulating layer formed on the gate electrode and having a contact hole formed in the interlayer insulating layer; a source/drain electrode that is electrically connected to the source/drain region; a protective layer including a passivation layer and/or planarization layer formed on the interlayer insulating layer; and a display device. The at least one pad may be electrically connected to the gate electrode or the source/drain electrode.

The at least one pad may be patterned of a same material as a material for forming the gate electrode. The stiffener may be patterned of a same material as a material for forming the source/drain electrode.

The flexible display apparatus may include an integrated circuit (IC) mounted on the circuit board. The circuit board may include a flexible film.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
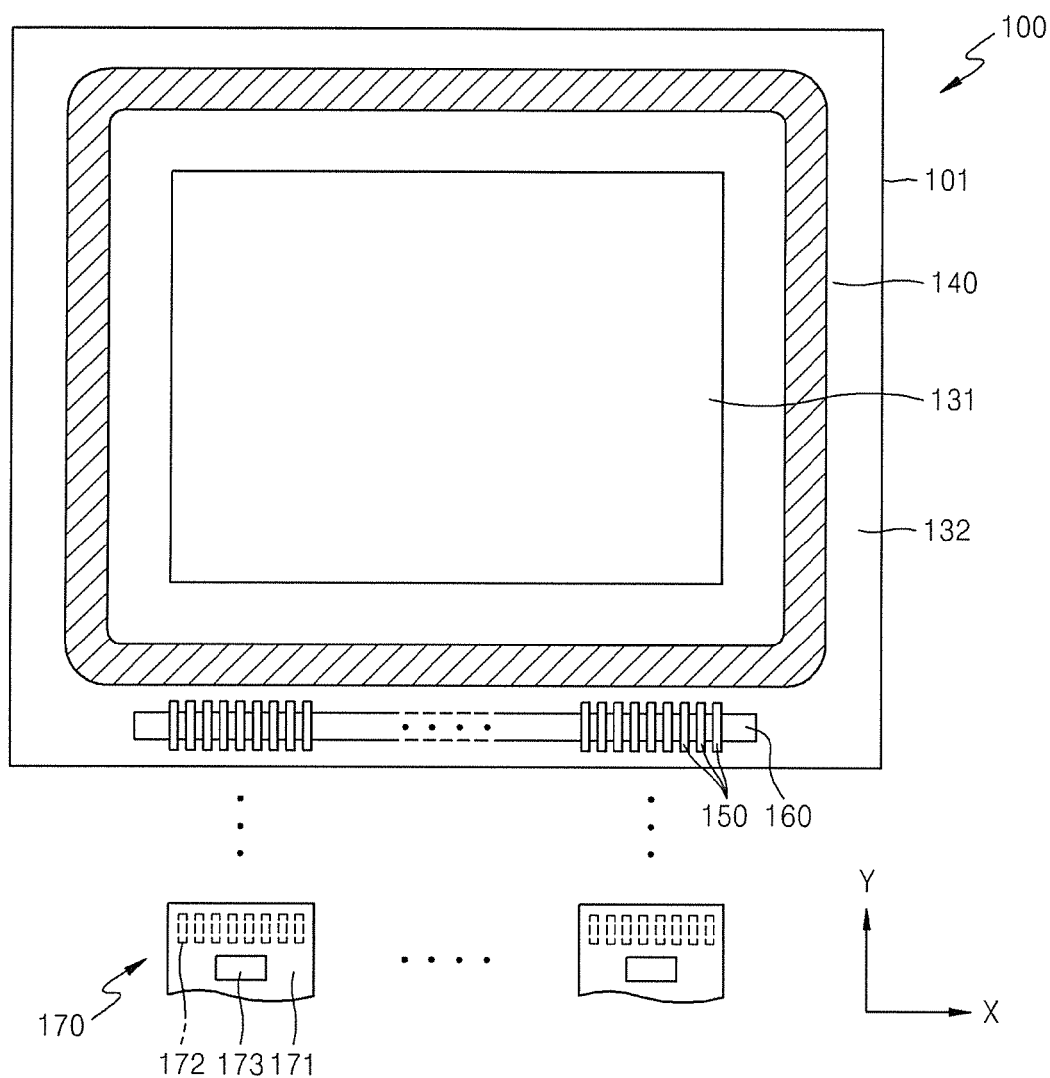
FIG. 1 is a plan view of a flexible display apparatus according to an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the detailed description, certain detailed explanations of related art may be omitted when they may unnecessarily obscure the essence of the described embodiments.

While such terms as "first," "second," etc., may be used to describe various components, such components are not limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

A flexible display apparatus according to certain embodiments of the invention will be described below in more detail with reference to the accompanying drawings. Those components that are the same or are in correspondence are given the same reference numeral regardless of the figure number, and redundant explanations may be omitted.

FIG. 1 illustrates a structure of a flexible display apparatus 100 according to an embodiment of the present invention.

Referring to FIG. 1, the flexible display apparatus 100 includes a display unit 131 that displays an image on a first flexible substrate 101. A plurality of pixel areas are formed in the display unit 131, and light is emitted from the plurality of pixel areas when a voltage (for example, a predetermined voltage) is applied to the display unit 131. A non-display area 132 is formed outside the display unit 131. A sealant 140 is disposed (for example, located) around the display unit 131. A plurality of pads 150 are formed on the non-display area 132 that is disposed outside the sealant 140.

In addition, when the flexible display apparatus 100 is an organic light-emitting display apparatus, a plurality of wire lines (for example, a driving voltage supply line for supplying a driving voltage Vdd to a driving line of the pixel areas, and a power supply line for supplying power to one electrode of an organic light-emitting device of the pixel areas) or various circuit units (such as a vertical driving circuit unit and a horizontal driving circuit unit for controlling signals applied to the pixel areas), are disposed outside the display unit 131.

A circuit board 170 is disposed on the pads 150. The circuit board 170 may be a flexible printed cable (FPC) and includes a flexible film 171. Circuit terminals 172 that correspond to the plurality of pads 150 are patterned on one side of the flexible film 171, i.e., on one side of the flexible film 171 that faces each pad 150. An integrated circuit (IC) 173 is mounted on the other side of the flexible film 171. Further, a stiffener 160 for reinforcing the strength and rigidity of the flexible display apparatus 100 is patterned at an edge of the first flexible substrate 101.

Figure 2:
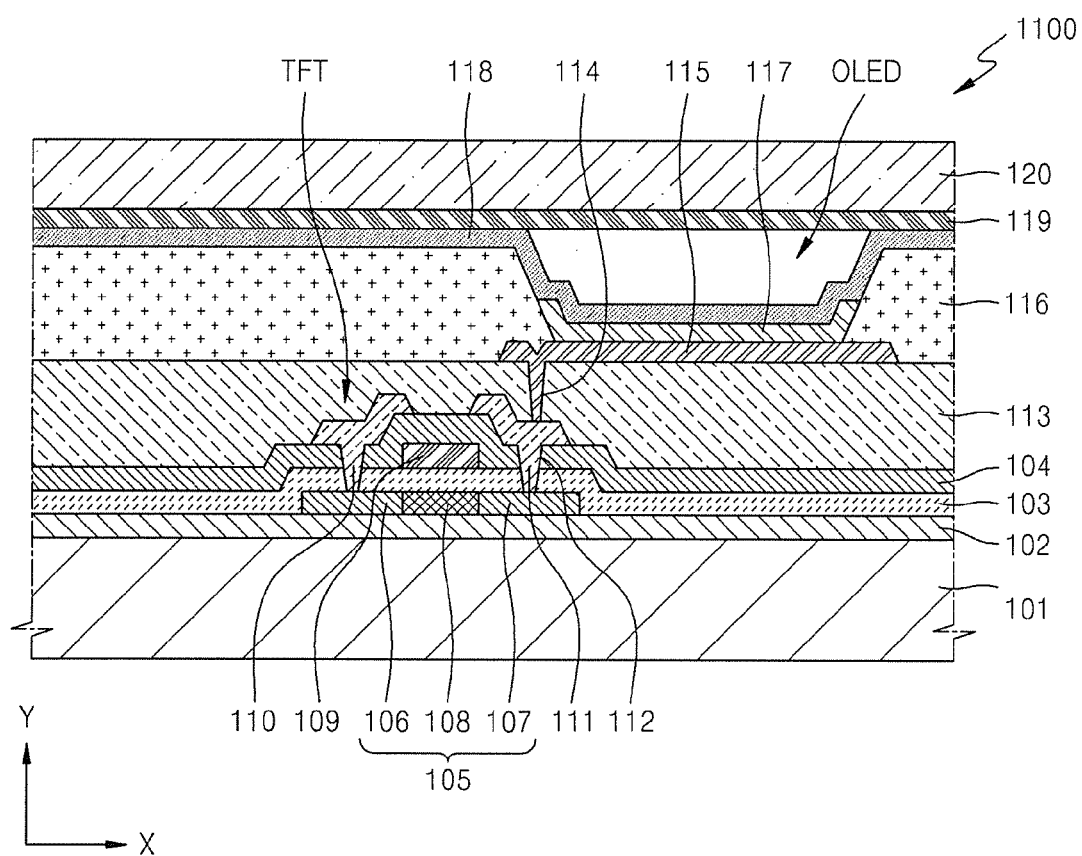
FIG. 2 is an enlarged cross-sectional view of a sub-pixel of a display unit illustrated in FIG. 1, according to an embodiment of the present invention.

FIG. 2 illustrates one sub-pixel 1100 of the display unit 131 illustrated in FIG. 1, according to an embodiment of the present invention.

Referring to FIG. 2, the first flexible substrate 101 is included in the flexible display apparatus 100. The first flexible substrate 101 may be formed of a material that has a smaller specific gravity than a glass substrate. The first flexible substrate 101 should be lightweight, durable (e.g., not fragile), and flexible, for example, a polymer, such as a plastic film.

As the thickness of the first flexible substrate 101 decreases, the first flexible substrate 101 becomes more lightweight and may become more appropriate for a thin display. However, elements and thin layers to be formed on the first flexible substrate 101 need to have thicknesses and masses that are capable of being supported by the first flexible substrate 101 when the flexible display apparatus 100 is manufactured.

To this end, the first flexible substrate 101 is a thin substrate having a thickness of about 10 to 100 micrometers. When the thickness of the first flexible substrate 101 is less than 10 micrometers, the shapes of the elements and the thin layers to be formed on the first flexible substrate 101 are not stably maintained when the first flexible substrate 101 is manufactured. When the thickness of the first flexible substrate 101 is greater than 100 micrometers, a flexibility characteristic of the first flexible substrate 101 is not easily maintained. The first flexible substrate 101 may be formed of a polymer, such as polyimide (PI), polycarbonate (PC), polyethersulphone (PES), polyethylene terephthalate (PET), polyethylenenaphthalate (PEN), polyarylate (PAR), or fiber glass reinforced plastic (FRP).

A first barrier layer 102 is formed on the first flexible substrate 101. The first barrier layer 102 may be formed of an inorganic material, such as SiOx, SiNx, SiON, AlO, or AlON, or an organic material, such as acryl or PI, or by alternately stacking an organic material and an inorganic material. The first barrier layer 102 serves, for example, to block oxygen and moisture, to prevent diffusion of moisture or an impurity generated from the first flexible substrate 101, or to adjust a heat transfer speed during a crystallization process so that crystallization of a semiconductor may be smoothly performed.

A thin film transistor (TFT) is formed on the first barrier layer 102. The thin film transistor according to the embodiment of FIG. 2 is a top gate type thin film transistor, but in other embodiments may be a thin film transistor having another structure, such as a bottom gate type thin film transistor. When a thin film transistor is a top gate type thin film transistor, a semiconductor active layer 105, a gate insulating layer 103, a gate electrode 109, an interlayer insulating layer 104, a source electrode 110, a drain electrode 111, and a protective layer (passivation layer and/or planarization layer) 113 are formed on the first barrier layer 102. The source electrode 110 and the drain electrode 111 may also each be referred to as a source/drain electrode.

When the semiconductor active layer 105 is formed of polysilicon, amorphous silicon is formed and is crystallized into polysilicon. Various methods, such as rapid thermal annealing (RTA), solid phase crystallization (SPC), excimer laser annealing (ELA), metal-induced crystallization (MIC), metal-induced lateral crystallization (MILC), and sequential lateral solidification (SLS), may be used as a method of crystallizing amorphous silicon.

A method that does not involve a high-temperature heating process may be used to form the semiconductor active layer 105 on the first flexible substrate 101. For example, when crystallization is performed using a low temperature polysilicon (LTPS) process, activation of the semiconductor active layer 105 is performed by radiating a laser on the semiconductor active layer 105 for a short time so that an entire process related to the first flexible substrate 101 may be performed at a temperature less than 300° C. Thus, a thin film transistor may be formed on a first flexible substrate 101 that is formed of a polymer.

The semiconductor active layer 105 includes a source region 106 and a drain region 107 that are formed by doping the semiconductor active layer 105 with N-type impurity ions or P-type impurity ions. The semiconductor active layer 105 further includes a channel region 108 that is disposed between the source region 106 and the drain region 107 and is not doped with an impurity. The source region 106 and the drain region 107 may also each be referred to as a source/drain region.

The gate insulating layer 103 may be vapor deposited on the semiconductor active layer 105. The gate insulating layer 103 may be formed, for example, as a single layer formed of $SiO_2$, or a double layer formed of $SiO_2$ and $SiN_x$. The gate electrode 109 is formed on a region (for example, a predetermined region) of the gate insulating layer 103. The gate electrode 109 is connected to a gate line for applying a thin film transistor on/off signal. The gate electrode 109 may be formed of a single metal or metals and may be formed as a single layer, such as Mo, MoW, Cr, Al, an Al alloy, Mg, Al, Ni, W, or Au, or layers formed of mixtures thereof.

The interlayer insulating layer 104 is formed on the gate electrode 109. In addition, the source electrode 110 and the drain electrode 111 are electrically connected to the source region 106 and the drain region 107, respectively, via a corresponding first contact hole 112 in the interlayer insulating layer 104. The interlayer insulating layer 104 may be formed of an insulating inorganic material, such as $SiO_2$ or $SiN_x$, or an insulating organic material. The first contact hole 112 may be formed by selectively removing portions of the gate insulating layer 103 and the interlayer insulating layer 104 from the thin film transistor.

The protective layer 113 is formed on the source electrode 110 and the drain electrode 111. The protective layer 113 serves, for example, to protect the thin film transistor or to planarize the thin film transistor. The protective layer 113, for example, may be configured in various shapes, may be formed of an organic material (such as benzocyclobutene or acryl) or an inorganic material (such as SiNx), may be modified in various ways, and may be formed as a single layer, a double layer, or multiple layers.

A display device, such as an organic light emitting diode (OLED), is formed on the thin film transistor. Although the embodiment of FIG. 2 illustrates an organic light-emitting device as the display device, aspects of the present invention are not limited thereto, and other display devices may be formed on the thin film transistor in other embodiments.

Above the thin film transistor, a first electrode 115 is electrically connected to the source electrode 110 or the drain electrode 111 via a second contact hole 114 through the protective layer 113 in order to form the organic light-emitting device. The first electrode 115 serves, for example, as an anode among electrodes disposed on the organic light-emitting device and may be formed of various conductive materials. The first electrode 115 may be formed as a transparent electrode or a reflective electrode.

When the first electrode 115 is formed as a transparent electrode, the first electrode 115 may include ITO, IZO, ZnO, $In_2O_3$, or combinations thereof. When the first electrode 115 is formed as a reflective electrode, the first electrode 115 may be formed by forming a reflective layer using Ag, Mg, Al, Pt, Pd, Au, Ni, Nd, Ir, Cr, or a compound thereof, and then by forming ITO, IZO, ZnO, $In_2O_3$, or a compound thereof on the reflective layer. A pixel-defining layer (PDL) 116 is formed above the protective layer 113 by using an organic material that covers a portion of the first electrode 115 of the organic light-emitting device.

Above the first electrode 115, an organic layer 117 is formed on a portion of the first electrode 115 that is exposed by etching a portion of the PDL 116. A second electrode 118 of the organic light-emitting device is formed on the organic layer 117. The first electrode 115 and the second electrode 118 may be insulated from each other by the organic layer 117, and light is emitted from the organic layer 117 by applying voltages with different polarities to the organic layer 117.

In the embodiment of FIG. 2, the organic layer 117 is patterned to correspond to each sub-pixel 1100, i.e., each patterned first electrode 115, for convenience of explanation, of each sub-pixel 1100. Aspects of the present invention are not limited thereto, and in other embodiments, the organic layer 117 may be formed as one body with the organic layer 117 of an adjacent sub-pixel 1100. In further embodiments, a portion of the organic layer 117 may be formed in each sub-pixel 1100, and another portion of the organic layer 117 may be formed as one body with the organic layer 117 of an adjacent sub-pixel 1100. In still further embodiments, various modifications of the organic layer 117 are possible.

The organic layer 117 may be formed of a low molecular weight organic material or a polymer organic material. When the organic layer 117 is formed of a low molecular weight organic material, the organic layer 117 may be formed in a single structure including a hole injection layer (HIL), a hole transport layer (HTL), an emissive layer (EML), an electron transport layer (ETL), and an electron injection layer (EIL), or a composite structure thereof. Available organic materials when the organic layer 117 is formed of a low molecular weight organic material may be copper phthalocyanine (CuPc), N,N'-Di(naphthalene-1-yl)-N,N'-diphenyl-benzidine (NPB), and tris-8-hydroxyquinoline aluminum (Alq3), or the like. These low molecular weight organic materials may be formed using vacuum deposition using masks, or the like.

When the organic layer 117 is formed of a polymer organic material, the organic layer 117 may have a structure including an HTL and an EML. In this regard, PEDOT may be used as the HTL, and a poly-phenylenevinylene (PPV)-based polymer organic material or a polyfluorene-based polymer organic material may be used as the EML. These polymer organic materials may be formed using screen-printing, ink-jet printing, or the like. It should be noted that the organic layer 117 having the above configuration is not limited thereto, and various embodiments may be applied to the organic layer 117.

The second electrode 118 may be formed as a transparent electrode or a reflective electrode, like the first electrode 115. When the second electrode 118 is a transparent electrode, after metal having a small work function (e.g., Li, Ca, LiF/Ca, LiF/Al, Al, Mg, or a compound thereof) is vapor deposited on the organic layer 117, an auxiliary electrode or a bus electrode line that is formed of a transparent electrode material (such as ITO, IZO, ZnO, $In_2O_3$, or a compound thereof) may be used to form the transparent electrode. When the second electrode 118 is a reflective electrode, the reflective electrode may be formed by vapor depositing Li, Ca, LiF/Ca, LiF/Al, Al, Mg, or a compound thereof on the entire surface of the organic layer 117.

The first electrode 115 may be formed to have a shape corresponding to an opening of each sub-pixel 1100 whether the first electrode 115 is formed as a transparent electrode or a reflective electrode. The second electrode 118 may be formed, for example, by vapor depositing a transparent electrode or a reflective electrode on the entire surface of a display region. The second electrode 118, however, is not necessarily limited to being formed by vapor depositing the transparent electrode or the reflective electrode on the entire surface of a display region. Further, the second electrode 118 may be formed in various patterns. In addition, positions of the first electrode 115 and the second electrode 118 may be opposite to the positions illustrated.

A second flexible substrate 120 is combined with an upper portion of the organic light-emitting device. The second flexible substrate 120 may be formed of a polymer, such as a plastic film, which is substantially the same as the material for forming the first flexible substrate 101. The second flexible substrate 120 is a thin substrate that may be easily bent. In other embodiments, after the organic light-emitting device is manufactured, the organic light-emitting device may be encapsulated by stacking an inorganic layer on the organic light-emitting device.

A second barrier layer 119 may be formed on one side of the second flexible substrate 120 that faces the organic light-emitting device. The second barrier layer 119 may be formed of an inorganic material, such as SiOx, SiNx, SiON, AlO, and AlON, or an organic material, such as acryl or PI. In other embodiments, the second barrier layer 119 may be formed by alternately stacking an organic material and an inorganic material. The second barrier layer 119 serves, for example, to block oxygen and moisture, to prevent diffusion of moisture or an impurity generated from the second flexible substrate 120, or to adjust a heat transfer speed during a crystallization process so that crystallization of a semiconductor may be smoothly performed.

The flexible display apparatus 100 having the above structure further includes the stiffener 160 for reinforcing the strength and rigidity of the flexible display apparatus 100. The stiffener 160 is formed in a pattern (for example, a predetermined pattern) to reduce or minimize expansion and contraction of the first flexible substrate 101 or the second flexible substrate 120 when the circuit terminals 172 of the circuit board 170 are connected to the pads 150, for example, by using hot fusion.

Figure 3:
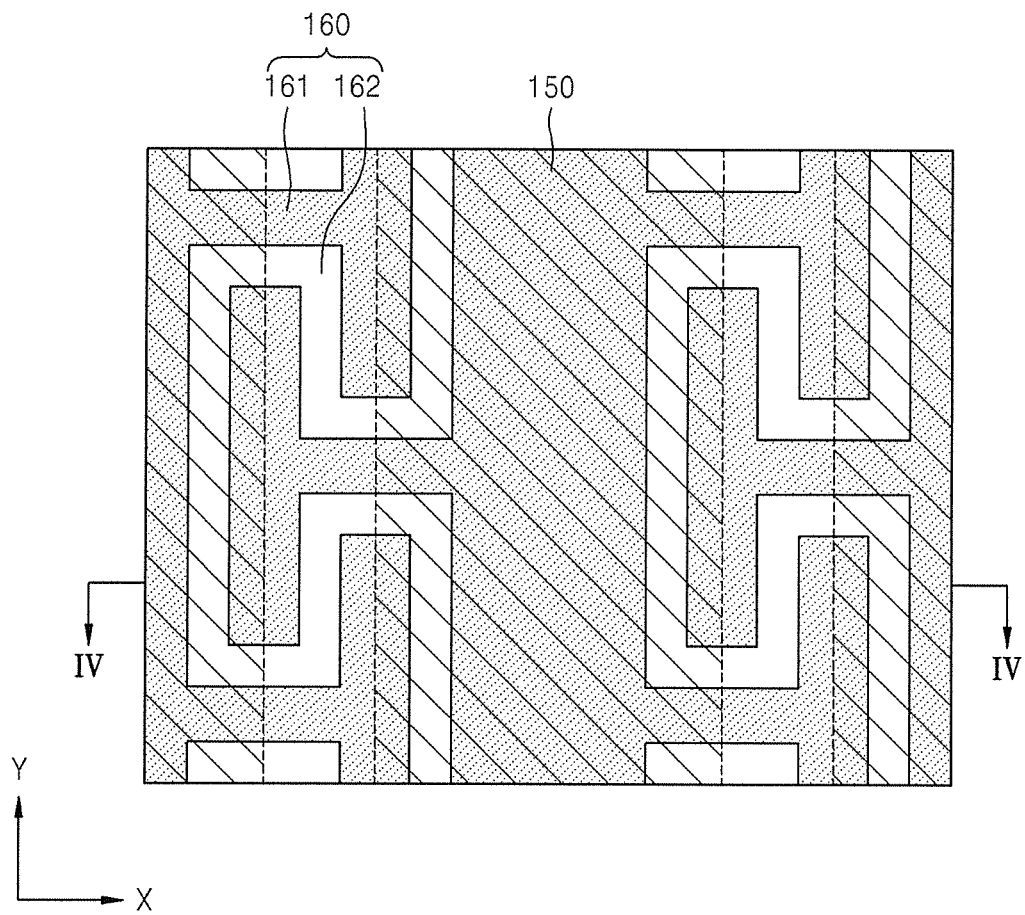
FIG. 3 is a plan view of a portion formed by patterning a stiffener illustrated in FIG. 1.
Figure 4:
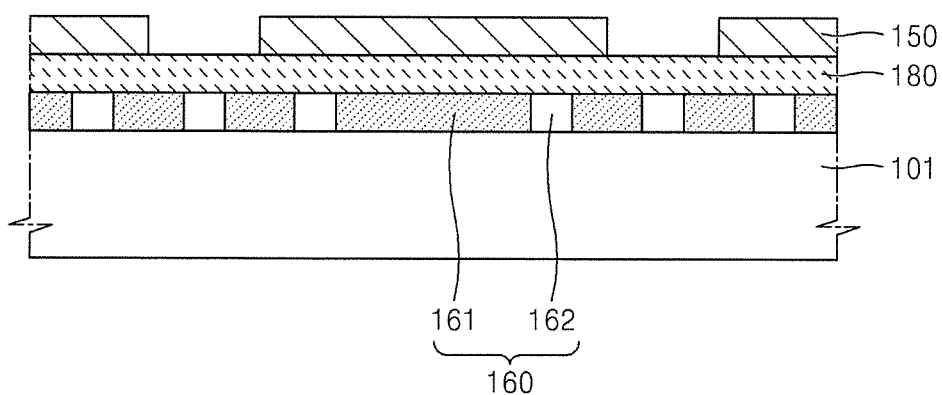
FIG. 4 is a cross-sectional view taken along a line IV-IV of FIG. 3.

FIG. 3 is a plan view of a portion formed by patterning the stiffener 160 illustrated in FIG. 1. FIG. 4 is a cross-sectional view taken along a line IV-IV of FIG. 3.

Referring to FIGS. 3 and 4, the stiffener 160 is formed on the first flexible substrate 101. The stiffener 160 is arranged along one edge of the first flexible substrate 101. The stiffener 160 may include a plurality of reinforcement lines 161 coinciding with the pads 150. Accordingly, the plurality of reinforcement lines 161 may be arranged apart from one another by a distance (for example, a predetermined distance) in an X-direction or arranged at regular intervals in the X-direction of the first flexible substrate 101. In addition, each of the reinforcement lines 161 may be formed in a particular pattern (for example, a zipper, with extensions in the X-direction forming a complementary pattern with extensions of adjacent reinforcement lines 161, as shown in FIG. 3) in a Y-direction of the first flexible substrate 101.

The stiffener 160 may include reinforcement lines 161 having solid portions in the Y-direction coinciding with the pads 150 and extending portions in the X-direction that extend from the solid portions towards the adjacent reinforcement lines in complementary patterns. Accordingly, the stiffener 160 may have a structure in which a plurality of reinforcement lines 161 are arranged adjacent to one another on the first flexible substrate 101 at regular intervals and/or are spaced apart from one another by a distance (for example, a predetermined distance) in particular patterns with a space 162 being formed between the adjacent reinforcement lines 161.

In the embodiment of FIG. 3, each reinforcement line 161 is patterned in a zipper shape in the Y-direction of the first flexible substrate 101, and the space 162 in which the reinforcement lines 161 are not formed is formed between the adjacent reinforcement lines 161. The reinforcement lines 161 each having a zipper-shaped pattern constitute one aggregate having a regular pattern so that the reinforcement lines 161 are repeatedly arranged in the X-direction of the first flexible substrate 101.

Aspects of the invention are not limited thereto, and in other embodiments, each reinforcement line 161 may have a shape in which the stiffener 160 is not formed in one pattern. For example, the stiffener 160 may be formed in particular patterns that are separated from one another, such as a plurality of serpentine type patterns, a plurality of zigzag type patterns, a plurality of network type patterns, a plurality of honeycomb type patterns, a plurality of straight type patterns, a plurality of curve type patterns, a plurality of circular shapes, or a plurality of polygonal shapes.

The plurality of reinforcement lines 161 are formed directly on a surface of the first flexible substrate 101. The plurality of reinforcement lines 161 are formed of metal. Although each reinforcement line 161 may be independently formed on the first flexible substrate 101, in other embodiments of a manufacturing process, each reinforcement line 161 may be formed of the same material as the material for forming the gate electrode 109 of FIG. 2 and concurrently with the gate electrode 109 being formed within the display unit (see 131 of FIG. 1). However, the plurality of reinforcement lines 161 are not directly connected to the electrodes formed within the display unit 131 and thus, are not necessarily limited thereto.

An insulating layer 180 may be formed on a top surface of each reinforcement line 161. The insulating layer 180 is formed of an insulating material. The insulating layer 180 has a size that covers the plurality of reinforcement lines 161 in the X-direction of the first flexible substrate 101.

The plurality of pads 150 are patterned on the insulating layer 180. The plurality of pads 150 are at regular intervals or are spaced apart from one another by a distance (for example, a predetermined distance) in the X-direction of the first flexible substrate 101. For instance, the pads may repeat with the same X-direction separation (distance or interval) as that of the reinforcement lines 161, as shown in FIG. 3. The plurality of pads 150 are formed of metal.

Although the plurality of pads 150 may be formed on the first flexible substrate 101 by performing an additional process, when the source electrode 110 or the drain electrode 111 is formed within the display unit 131, the plurality of pads 150 may also be formed in the same process and of the same material as the material for forming the source electrode 110 or the drain electrode 111. In this regard, the plurality of pads 150 may be electrically connected to the gate electrode 109, the source electrode 110, or the drain electrode 111 that is formed within the display unit 131. In addition, the plurality of pads 150 is electrically connected to the circuit terminals 172 of the circuit board 170 by using hot fusion.

The plurality of pads 150 may overlay the plurality of reinforcement lines 161 in a vertical direction and are electrically insulated from one another by the insulating layer 180, as shown in FIGS. 3-4. Aspects of the invention are not limited thereto, however, and in other embodiments, by forming each reinforcement line 161 in a particular pattern, for example, a fish bone pattern, without forming the insulating layer 180, each reinforcement line 161 and a pad 150 corresponding to each reinforcement line 161 may contact each other in the vertical direction.

A thermal expansion coefficient of each reinforcement line 161 may be smaller than a thermal expansion coefficient of the first flexible substrate 101. To this end, the first flexible substrate 101 is formed of a polymer, and each reinforcement line 161 is formed of metal. Furthermore, the plurality of pads 150 is arranged in the X-direction of the first flexible substrate 101. Thus, when viewed from above, the plurality of reinforcement lines 161 that constitute an aggregate (having a regular pattern) may be arranged in the X-direction of the first flexible substrate 101 like that of the pads 150. In addition, the aggregate of the plurality of reinforcement lines 161 may have a size (for example, a perimeter) that covers (for example, contains) that of the pads 150.

In the flexible display apparatus 100, the plurality of reinforcement lines 161 are arranged on the non-display area 132 in particular patterns that are separated from one another, and the pads 150 are arranged on the plurality of reinforcement lines 161 so that at least a portion of the pads 150 overlays the reinforcement lines 161 in the vertical direction. Accordingly, when the circuit terminals 172 of the circuit board 170 are connected to the pads 150 by using hot fusion, expansion or contraction of the first flexible substrate 101 may be reduced or minimized by the plurality of reinforcement lines 161. Thus, the circuit terminals 172 of the circuit board 170 may be easily connected to the pads 150 at their regular positions.

As described above, in a flexible display apparatus according to an embodiment of the present invention, a stiffener having a plurality of reinforcement lines that are separated from one another along one edge of a flexible substrate is patterned in a shape (for example, a predetermined shape) so that a flexibility characteristic of the flexible display apparatus may be maintained and connection of circuit terminals of a circuit board to pads of the flexible substrate may be reinforced.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. A flexible display apparatus comprising:
a substrate;
a display unit for displaying an image and located on the substrate;
a non-display area located on the substrate and formed outside the display unit, the non-display area comprising:
a stiffener comprising a plurality of reinforcement lines formed on the substrate and patterned to reduce or prevent thermal deformation of the substrate;
at least one pad formed on and electrically insulated from each of the reinforcement lines; and
a stiffener insulating layer between the reinforcement lines and the at least one pad, the stiffener insulating layer being configured to electrically insulate each of the reinforcement lines from the at least one pad; and
a circuit board comprising circuit terminals to be electrically connected to the at least one pad,
wherein the reinforcement lines are arranged apart from one another by a first distance in one direction of the substrate and are arranged in another direction of the substrate to constitute an aggregate having a regular pattern,
wherein the display unit comprises an organic light-emitting display apparatus comprising:
a semiconductor active layer having a source/drain region and a channel region;
a gate insulating layer formed on the semiconductor active layer;
a gate electrode formed on the gate insulating layer;
an interlayer insulating layer formed on the gate electrode and having a contact hole formed in the interlayer insulating layer;
a source/drain electrode that is electrically connected to the source/drain region;
a protective layer comprising a passivation layer and/or planarization layer formed on the interlayer insulating layer; and
a display device,
wherein the at least one pad is electrically connected to the gate electrode or the source/drain electrode,
wherein the at least one pad is patterned of a same material as a material for forming the source/drain electrode, and
wherein the stiffener is patterned of a same material as a material for forming the gate electrode.

2. The flexible display apparatus of claim 1, wherein patterns of the reinforcement lines are separated from one another, and
a space is formed between adjacent reinforcement lines.

3. The flexible display apparatus of claim 2, wherein the reinforcement lines comprise one selected from the group consisting of a plurality of serpentine type patterns, a plurality of zigzag type patterns, a plurality of network type patterns, a plurality of honeycomb type patterns, a plurality of straight type patterns, a plurality of curve type patterns, a plurality of circular shapes, and a plurality of polygonal shapes.

4. The flexible display apparatus of claim 1, wherein the at least one pad overlays at least a portion of the reinforcement lines.

5. The flexible display apparatus of claim 4, wherein the reinforcement lines are arranged between the at least one pad and the substrate.

6. The flexible display apparatus of claim 4, wherein an insulating material is further deposited between the stiffener and the at least one pad.

7. The flexible display apparatus of claim 1, wherein
the at least one pad is arranged in a first direction of the substrate,
each reinforcement line is arranged in the first direction, and
a perimeter of an aggregate of the reinforcement lines is arranged to contain a perimeter of the at least one pad in a second direction of the substrate that crosses the first direction.

8. The flexible display apparatus of claim 1, wherein a thermal expansion coefficient of each reinforcement line is smaller than a thermal expansion coefficient of the substrate.

9. The flexible display apparatus of claim 8, wherein
the substrate is formed of a polymer, and
each reinforcement line is formed of metal.

10. The flexible display apparatus of claim 1, wherein the substrate comprises a flexible substrate.

11. The flexible display apparatus of claim 10, wherein the substrate is formed of one selected from the group consisting of polyimide (PI), polycarbonate (PC), polyethersulphone (PES), polyethylene terephthalate (PET), polyethylenenaphthalate (PEN), polyarylate (PAR), or fiber glass reinforced plastic (FRP).

12. The flexible display apparatus of claim 1, wherein
the at least one pad is arranged on the non-display area of the substrate, and
the stiffener is patterned between the substrate and the at least one pad.

13. The flexible display apparatus of claim 12, wherein an insulating material is further deposited between the at least one pad and the stiffener.

14. The flexible display apparatus of claim 1, further comprising an integrated circuit (IC) mounted on the circuit board, wherein the circuit board comprises a flexible film.

* * * * *